United States Patent [19]

Mihashi et al.

[11] Patent Number: 4,841,535
[45] Date of Patent: Jun. 20, 1989

[54] SEMICONDUCTOR LASER DEVICE

[75] Inventors: Yutaka Mihashi; Yutaka Nagai; Kenji Ikeda, all of Itami, Japan

[73] Assignee: Mitsubishi Denki Kabushiki Kaisha, Japan

[21] Appl. No.: 231,003

[22] Filed: Aug. 11, 1988

[30] Foreign Application Priority Data

Aug. 19, 1987 [JP] Japan .................................. 62-205764

[51] Int. Cl.$^4$ .............................................. H01S 3/19
[52] U.S. Cl. .................................................... 372/46
[58] Field of Search ........................ 372/48, 46, 44, 45

[56] References Cited

U.S. PATENT DOCUMENTS 4,667,332  5/1987  Mihashi et al. .......................... 372/45
4,734,385  3/1988  Mihashi et al. ....................... 437/129

FOREIGN PATENT DOCUMENTS 0147292  9/1982  Japan ..................................... 372/48

OTHER PUBLICATIONS

Mihashi et al, "A Novel Self-Aligned Laser with Small Astigmatism Grown by MO-CVD", 17th Conference on Solid State Devices and Materials, Tolyo, 1985, pp. 63-66.
Mihasi et al, "A Novel Self-Aligned AlGaAs Laser with Bent Active Layer Grown by MOCVD", IEEE 1985, pp. 646-649.

Primary Examiner—James W. Davie
Attorney, Agent, or Firm—Leydig, Voit & Mayer

[57] ABSTRACT

A semiconductor laser device includes semiconductor layers including a semiconductor layer having a stripe groove having a reverse trapezoidal cross section and a bent active layer spaced from and in the configuration of the groove wherein the bottom width of the groove is less than 2 microns and the distance from the active layer to the bottom of the groove is more than 0.6 micron.

6 Claims, 4 Drawing Sheets

F I G .3.
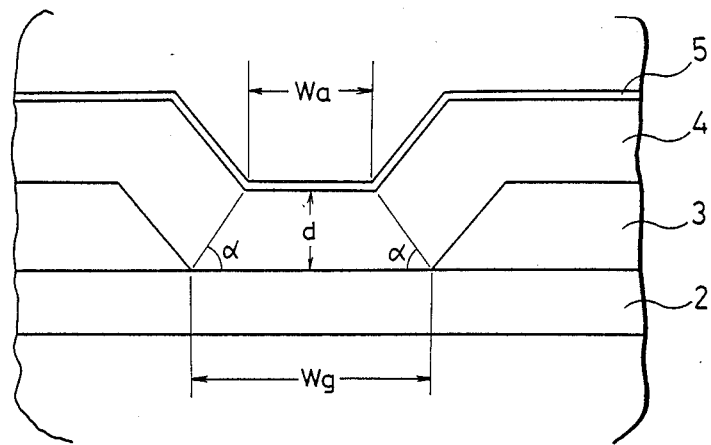

SEMICONDUCTOR LASER DEVICE

FIELD OF THE INVENTION

The present invention relates to a semiconductor laser device which can produce fundamental transverse mode oscillation and has a long lifetime.

BACKGROUND OF THE INVENTION

Liquid phase epitaxy (LPE) has been mostly used as a technique of crystal growth for mass production of semiconductor laser devices. Lately, the conversion from LPE to MO-CVD (Metal Organic Chemical Vapor Deposition) which has the capability of precision control of layer thickness and is suitable for mass production has hastened in view of enhancement in efficiency and reduction in cost.

FIG. 4 shows a cross-sectional view of a prior art SBA (Self-Aligned Bent Active layer) laser which has a laser structure suitable for production by MO-CVD and which is disclosed in Japanese Laid-open Patent Publication No. 60-192380. In FIG. 4, reference numeral 1 designates a p-type GaAs substrate. A first p-type AlGaAs cladding layer 2 is provided on the p-type GaAs substrate 1. An n-type GaAs current blocking layer 3 is provided on the first p-type AlGaAs cladding layer 2. A second p-type AlGaAs cladding layer 4 is provided on the current blocking layer 3. A p-type or n-type AlGaAs active layer 5 is provided on the second p-type AlGaAs cladding layer 4. An n-type AlGaAs cladding layer 6 is provided on the active layer 5. An n-type GaAs contact layer 7 is provided on the n-type AlGaAs cladding layer 6. An n-side electrode 8 is provided on the contact layer 7. A p-side electrode 9 is provided on the rear surface of the substrate 1. A stripe groove 10 is provided in the current blocking layer 3.

In this SBA laser structure, the bottom width of stripe groove 10 is above 2 $\mu$m, and the thickness of second p-type AlGaAs cladding layer 4 is about 0.2 $\mu$m.

This laser structure can be produced in two Mo-CVD crystal growth of steps. In the first crystal growth step, the first p-type AlGaAs cladding layer 2 and n-type GaAs current blocking layer 3 are produced on the p-type GaAs substrate 1. After the first crystal growth step, the stripe groove 10 is produced by etching. In the second crystal growth step, the second p type AlGaAs cladding layer 4, active layer 5, and n type AlGaAs cladding layer 6 are successively grown on the wafer, thereby constituting a double-hetero-junction structure. In the second crystal growth step by MO-CVD, the active layer 5 is grown to have a bent configuration like the step-like configuration of the stripe groove 10.

The device operates as follows.

When a voltage is applied to this laser with making the side of p-side electrode 9 plus, current flows concentratedly through the aperture portion of the stripe groove 10. Then, holes are injected into the flat portion 11 of the active layer 5 near the bottom of the stripe groove 10 from the side of second p-type AlGaAs cladding layer 4 and electrons are injected thereinto from the side of n-type AlGaAs cladding layer 6, and they recombine to produce light emission. When current is increased above the threshold current, the device starts laser ocsillation. The active layer of this SBA has a bent configuration similar to stripe groove 10, and at a plane including active layer 5 at the bottom area of the stripe groove 10, the effective refractive index changes in the horizontal direction. Accordingly, laser oscillation occurs at the flat portion 11 of the bent active layer 5, which portion becomes an active region.

In the prior art SBA type semiconductor laser device of such a construction, the bottom width of stripe groove is as large as 2 $\mu$m or more and the distance from the active region to bottom of the groove is small as about 0.2 $\mu$m. Such a configuration means produces a wide active region which makes transverse mode laser oscillation unstable. The small distance from the active region to bottom of the groove of about 0.2 $\mu$m means that a regrowth interface containing a high density of lattice defects and dislocations is located near the active layer. This regrowth interface location results in the likelihood that the device may deteriorate because of these lattice defects in a long-term operation.

SUMMARY OF THE INVENTION

An object of the present invention is to provide an SBA type semiconductor laser device capable of producing fundamental transverse mode oscillation and lengthy lifetime.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, a semiconductor laser device including a bent active layer is produced on a semiconductor layer disposed in a stripe groove having a reverse trapezoidal cross section so that the bent active layer has the step-like configuration of the groove, wherein the bottom width of the groove is less than 2 $\mu$m and the distance from the active region to the bottom of the groove is more than 0.6 $\mu$m.

BRIEF DESCRIPTION OF THE DRAWINGS

FIG. 3 is a diagram showing relationship between width of the active region and width of the stripe groove.

DETAILED DESCRIPTION OF THE PREFERRED EMBODIMENTS

An embodiment of the present invention will be described in detail with reference to the drawings.

Figure 1:
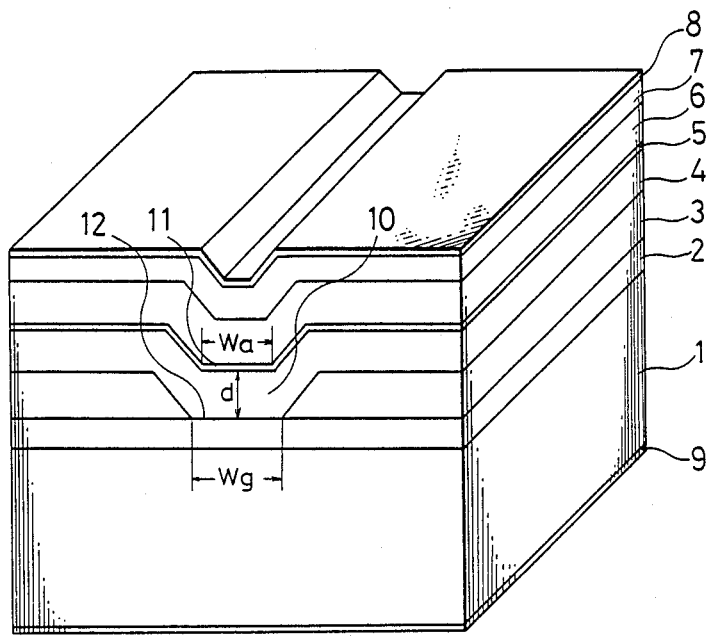
FIG. 1 is a cross-sectional perspective view showing a semiconductor laser device according to the present invention.

FIG. 1 shows a cross-sectional perspective view of a semiconductor laser device as an embodiment of the present invention. In FIG. 1, reference numeral 1 designates a p-type GaAs substrate. A first p-type AlGaAs cladding layer 2 is provided on the p-type GaAs substrate 1. An n-type GaAs current blocking layer 3 is provided on the first p-type AlGaAs cladding layer 2. A second p-type AlGaAs cladding layer 4 is provided on the current blocking layer 3. A p-type or n-type AlGaAs (or GaAs) active layer 5 is provided on the second p-type AlGaAs cladding layer 4. An n-type Al- GaAs cladding layer 6 is provided on the active layer 5. An n-type GaAs contact layer 7 is provided on the n-type AlGaAs cladding layer 6. An n-side electrode 8 is provided on the contact layer 7. A p-side electrode 9 is provided on the rear surface of the substrate 1. A stripe groove 10 is provided in the current blocking layer 3. Numeral 11 designates an active region and numeral 12 designates a regrowth interface.

Figure 4:
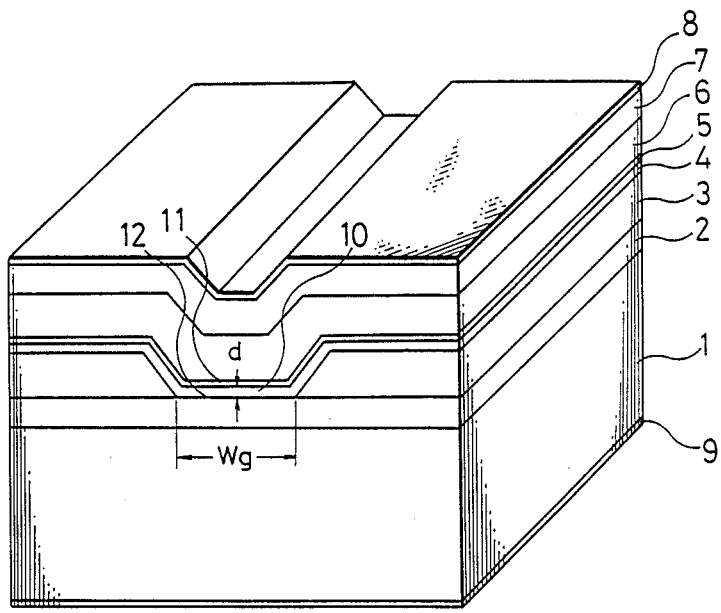
FIG. 4 is a cross-sectional perspective view showing a prior art SBA laser.

The construction of respective layers of this embodiment are fundamentally similar as those of the prior art SBA laser shown in FIG. 4. In this embodiment, however, bottom width Wg is less than 2 μm (Wg<2 μm) and distance d is more than 0.6 μm (d>0.6 μm) contrary to the prior art in which Wg is greater than 2 μm and distance d is about 0.2 μm.

The SBA laser of the this embodiment operates as follows.

Figure 2:
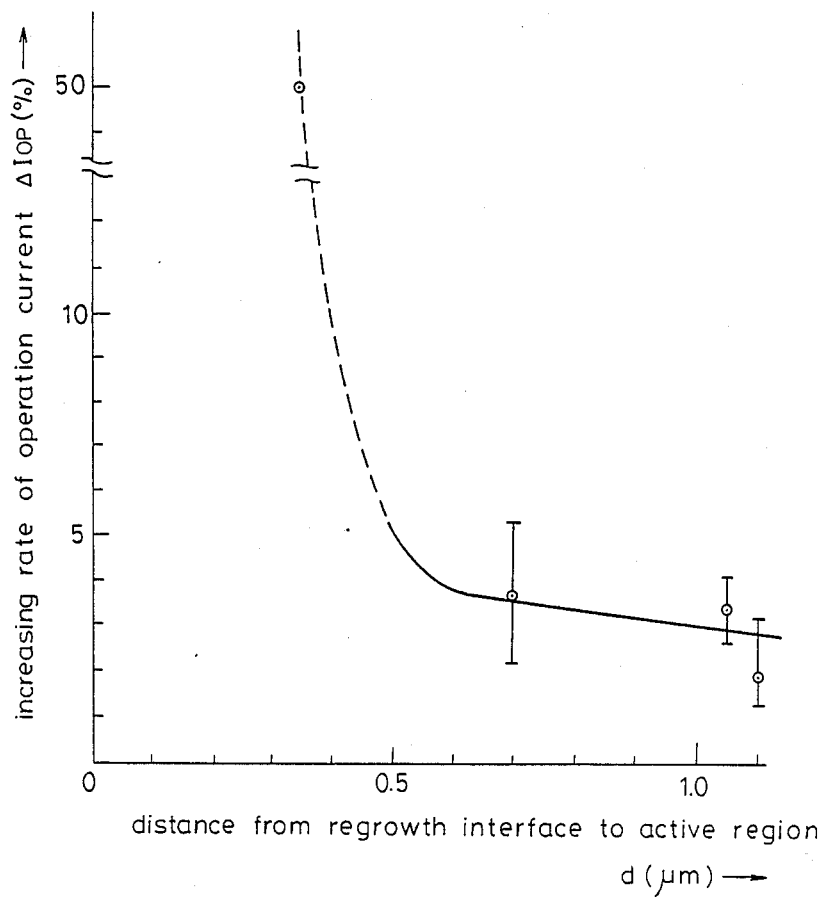
FIG. 2 is a diagram showing relationship between increasing rate of operation current of SBA laser and distance from the regrowth interface to the active region.

FIG. 2 shows relationship between distance d from the active region 11 to the regrowth interface 12 and the rate of increase, from the initial value, of the laser operation current, when the SBA laser is operated for 10 hours at a constant light output of 5 mW and at a temperature of 70° C. These conditions accelerate aging of the laser. As is apparent from this figure, where the distance d is shorter than 0.5 μm, the rate of increase of the operation current is extremely large, thereby causing problems in laser lifetime and reliability. In the invention, the distance d is more than 0.6 μm and the rate of increase of the operation current over the initial value is less than about 5%, thereby resulting sufficient lifetime for practical use.

FIG. 3 is a diagram showing the relationship between width Wa of the active region and bottom width Wg of the stripe groove in the neighborhood of stripe groove of SBA laser. In practical MO-CVD growth, the crystal growth progresses in a direction that should bury the groove. This means that an angle α formed by base of groove bottom and line which connects an end of groove bottom and an end portion of active region should be less than 90°. Accordingly, the longer the distance d from regrowth interface 12 to the bottom of the active region is, the narrower the width of active region is. The angle α also depends on the MO-CVD growth conditions, particularly on growth temperature $T_G$. For example, within a practical growth temperature range (700°~850° C.), the higher the growth temperature is, the larger the angle α is, i.e., the angle is about 55° at 700° C. and about 75° at 850° C. Thus, the width Wa of active region may be wider at higher growth temperatures.

In this way, the width Wa of the active region is determined by the width Wg of the stripe groove, growth condition (growth temperature), and thickness d of the second p-type AlGaAs cladding layer 4. In order to obtain an SBA laser which oscillates in a stable fundamental transverse mode, with high yield, experimental data shows that the width Wa of the active region is required to be less than 1.7 μm.

In this embodiment, since the width Wg is less than 2 μm and the thickness d is more than 0.6 μm, the width Wa of the active region becomes a little less than 1.7 μm at a growth temperature of about 850° C., the upper limit of MO-CVD growth temperature, thereby enabling production of a laser having a stable fundamental transverse mode oscillation. When the growth temperature is below 850° C., the angle α becomes less than 75° and the width Wa of active region becomes, of its own accord, less than 1.7 μm. A stable fundamental transverse mode oscillation laser can be obtained also in this case.

While in the above illustrated embodiment a AlGaAs SBA laser which on a p-type GaAs substrate is obtained, a laser produced on n-type substrate, or a laser produced from other material, i.e., AlGaInP series or InGaAsP series, having the same structure including a bent active layer, may be obtained.

As is evident from the foregoing description, according to the present invention, the bottom width of stripe groove is less than 2 μm and the distance from an active region to regrowth interface is more than 0.6 μm. Thus, the width of the active region can be made easily less than 1.7 μm, thereby enabling a stable fundamental transverse mode oscillation and lengthy lifetime.

What is claimed is:

1. A semiconductor laser comprising a plurality of semiconductor layers serially disposed on a substrate of a first conductivity type including a first cladding layer of the first conductivity type, a current blocking layer of a second conductivity type opposite the first conductivity type and forming a rectifying junction with said first cladding layer, said current blocking layer including a longitudinal groove extending through said current blocking layer to said first cladding layer, the longitudinal groove having a transverse width along said first cladding layer, a second cladding layer of the first conductivity type disposed on said current blocking layer and in and having the configuration of the groove, a bent active layer disposed on said second cladding layer and having the configuration of the groove and spaced from said first cladding layer at said groove by the thickness of said second cladding layer, a third cladding layer of the second conductivity type, and a contacting layer of the second conductivity type, and first and second electrodes disposed on said substrate and said contacting layer, respectively, wherein a resonant cavity includes a portion of said bent active layer opposite the longitudinal groove, the width of the longitudinal groove at said first cladding layer is less than 2 microns, and the thickness of said second cladding layer at the longitudinal groove is greater than 0.6 micron.

2. A semiconductor laser as defined in claim 1, wherein said semiconductor layers are produced by a Metal Organic Chemical Vapor Deposition method.

3. A semiconductor laser as defined in claim 1 wherein said semiconductor layers are formed of materials chosen from the group consisting of AlGaAs, GaAs, AlGaInP, GaP, InGaAsP, and InP.

4. A semiconductor laser as defined in claim 1 wherein the groove has a trapezoidal cross section.

5. A semiconductor laser as defined in claim 1 wherein the first conductivity type is p type.

6. A semiconductor laser as defined in claim 1 wherein said substrate, current blocking layer, and said contacting layer are GaAs and said first, second, and third cladding layers and said active layer are AlGaAs.

* * * * *